(12) United States Patent
Adam et al.

(10) Patent No.: US 9,437,679 B2
(45) Date of Patent: Sep. 6, 2016

(54) SEMI-CONDUCTOR DEVICE WITH EPITAXIAL SOURCE/DRAIN FACETTING PROVIDED AT THE GATE EDGE

(71) Applicant: International Business Machines Corporation, Armonk, NY (US)

(72) Inventors: Thomas N. Adam, Slingerlands, NY (US); Kangguo Cheng, Schenectady, NY (US); Bruce B. Doris, Slingerlands, NY (US); Ali Khakifirooz, Los Altos, CA (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/533,154

(22) Filed: Nov. 5, 2014

(65) Prior Publication Data

US 2015/0061021 A1 Mar. 5, 2015

Related U.S. Application Data

(62) Division of application No. 13/534,407, filed on Jun. 27, 2012, now Pat. No. 8,916,443.

(51) Int. Cl.
*H01L 29/08* (2006.01)
*H01L 27/12* (2006.01)
(Continued)

(52) U.S. Cl.
CPC ... *H01L 29/0847* (2013.01); *H01L 21/823412* (2013.01); *H01L 21/823418* (2013.01);
(Continued)

(58) Field of Classification Search
CPC .......... H01L 29/0843; H01L 29/0847; H01L 29/0649; H01L 29/0653; H01L 21/823481; H01L 21/823814; H01L 21/823418; H01L 21/7624; H01L 21/76264; H01L 27/1203; H01L 21/84; H01L 21/823425; H01L 29/0642; H01L 29/41783; H01L 21/8238; H01L 27/092; H01L 21/76; H01L 21/762; H01L 21/76224; H01L 21/76283
See application file for complete search history.

(56) References Cited

U.S. PATENT DOCUMENTS 4,998,150 A 3/1991 Rodder et al.
6,346,447 B1 * 2/2002 Rodder ............ H01L 29/41783
257/E21.43
(Continued)

FOREIGN PATENT DOCUMENTS

WO 2011064891 A1 6/2011

OTHER PUBLICATIONS

Rodder, "Raised Source/Drain MOSFET with Dual Sidewall Spacers", IEEE Electron Device Letters, vol. 12, No. 3, Mar. 1991, pp. 89-91.
(Continued)

*Primary Examiner* — Khiem D Nguyen
*Assistant Examiner* — Pauline Vu
(74) *Attorney, Agent, or Firm* — Yuanmin Cai, Esq.

(57) ABSTRACT

A semiconductor structure includes an active layer located on a substrate and a first and a second gate structure located on the active layer. A first raised epitaxial region is located on the active layer between the first and the second gate. The first raised epitaxial region has a first facet shaped edge and a first vertical shape edge, such that the first facet shaped edge is located adjacent the first gate structure. A second raised epitaxial region is also located on the active layer between the first and the second gate structure. The second raised epitaxial region has a second facet shaped edge and a second vertical shape edge, such that the second facet shaped edge is located adjacent the second gate structure. A trench region is located between the first and the second vertical shaped edge for electrically isolating the first and the second raised epitaxial region.

19 Claims, 8 Drawing Sheets

(51) Int. Cl.
*H01L 29/06* (2006.01)
*H01L 21/8234* (2006.01)
*H01L 21/84* (2006.01)

(52) U.S. Cl.
CPC ....... *H01L21/823481* (2013.01); *H01L 21/84* (2013.01); *H01L 27/1203* (2013.01); *H01L 29/0653* (2013.01)

(56) References Cited

U.S. PATENT DOCUMENTS

| | | | |
|---|---|---|---|
| 6,593,618 B2 | 7/2003 | Kamata et al. | |
| 7,423,323 B2 | 9/2008 | Chen et al. | |
| 7,439,568 B2 | 10/2008 | Cheng et al. | |
| 7,449,378 B2 | 11/2008 | Chidambarrao et al. | |
| 8,440,552 B1 * | 5/2013 | Chen | H01L 21/2255 257/623 |
| 2003/0203546 A1 * | 10/2003 | Burbach | H01L 21/743 438/151 |
| 2006/0148151 A1 * | 7/2006 | Murthy | H01L 21/02381 438/197 |
| 2006/0157797 A1 | 7/2006 | Tateshita | |
| 2006/0284269 A1 | 12/2006 | Ping et al. | |
| 2007/0018205 A1 * | 1/2007 | Chidambarrao | H01L 21/823412 257/288 |
| 2007/0045732 A1 * | 3/2007 | Lin | H01L 21/743 257/347 |
| 2007/0132057 A1 | 6/2007 | Curello et al. | |
| 2009/0065877 A1 * | 3/2009 | Tsuchiaki | H01L 21/32 257/410 |
| 2009/0283756 A1 * | 11/2009 | Hellings | H01L 29/0843 257/24 |
| 2009/0315120 A1 | 12/2009 | Shifren et al. | |
| 2010/0258869 A1 | 10/2010 | Morita et al. | |
| 2011/0193167 A1 | 8/2011 | Fung et al. | |
| 2011/0233688 A1 * | 9/2011 | Ren | H01L 27/1203 257/408 |
| 2011/0254090 A1 | 10/2011 | Cheng et al. | |
| 2013/0026575 A1 * | 1/2013 | Moroz | H01L 21/84 257/348 |
| 2013/0069160 A1 * | 3/2013 | Aquilino | H01L 21/76232 257/368 |
| 2013/0187205 A1 * | 7/2013 | Adam | H01L 21/823807 257/288 |
| 2013/0210207 A1 | 8/2013 | Fukuda et al. | |
| 2013/0313647 A1 * | 11/2013 | Aquilino | H01L 21/823807 257/368 |
| 2014/0001554 A1 | 1/2014 | Adam et al. | |

OTHER PUBLICATIONS

IBM, IP.com, "Stress Limited Oxidation for Forming Faceted Raised Source/Drain MOSFET Structures", IPCOM000152417D, May 2, 2007, 2 pages.

Disclosed Anonymously IP.com, "CMOS with dual in-situ doped raised source/drain Structures with Single Critical Mask and Method of forming CMOS with dual in-situ doped raised source/ drain Structures", IPCOM000203535D, Jan. 27, 2011, 3 pages.

Mazure, C. et al., "Facet engineered elevated source/drain by selective Si epitaxy for 0.35 micron MOSFETS," Dec. 13-16, 1992, Electron Devices Meeting 1992, IEDM, Technical Digest, International, vol., no. pp. 853-856.

Cheng et al., "Extremely Thin SOI (ETSOI) Technology: Past, Present, and Future", 2010 IEEE International SOI Conference, Oct. 2010, 4 pages.

* cited by examiner

SEMI-CONDUCTOR DEVICE WITH EPITAXIAL SOURCE/DRAIN FACETTING PROVIDED AT THE GATE EDGE

CROSS REFERENCE

The present application is a divisional of and claims priority under 35 U.S.C. §121 of U.S. patent application Ser. No. 13/534,407, filed on Jun. 27, 2012, which is incorporated by reference in its entirety.

BACKGROUND a. Field of the Invention

The present invention generally relates to semiconductor devices, and more particularly to structures, fabrication methods, and design structures having selective facetted epitaxial growth.

b. Background of Invention

In semiconductor structures, the epitaxial growth of regions such the source/drain (S/D) regions within Field Effect Transistors (FETs) may encounter faceting. In some instances, the created facets associated with these S/D epitaxially grown regions are desired, while in other instances, such facets may lead to undesirable effects.

Referring to FIG. 1A, within area A of semiconductor structure 100, the effect of epitaxially growing a raised S/D region 102 at the edge of an isolation region 104 (e.g., an STI region), as known in the art, is illustrated. This effect is shown in more detail in FIG. 1B, which depicts an expanded view of area A. Referring to FIG. 1B, the epitaxially grown raised S/D region 102 includes facets 106a-106c, which are formed at the edge of isolation region 104. Such faceting at the isolation region 104 edge is a known phenomenon associated epitaxial processes and is formed due to the crystalline growth (epitaxy) nature associated with the directional growth properties encountered at different surface atom concentrations.

Thus, growing the raised source/drain region 102 at the edge of isolation region 104 may cause the formation of facets 106a-106c. Facets 106a-106c along the edge of isolation region 104 are undesirable because the formed facets have less epitaxial material, which may lead to the entire epitaxial material associated with the facets being consumed during silicide formation. This reduces the contact area of the raised source/drain region 102 and, therefore, increases contact resistance with the raised source/drain region 102.

FIG. 2 depicts a cross sectional view of a semiconductor structure 200 that illustrates the effect of epitaxially growing raised S/D regions 202, 204, 206 at the edge of shallow trench isolation (STI) regions 208 and 210, as known in the art. As illustrated, facet 212 of raised S/D region 202 is formed at the edge of STI region 208. Similarly, facets 214 and 216 of raised S/D regions 204 and 206, respectively, are formed at the edge of STI region 210. As described above, facets associated with epitaxial raised S/D regions that are grown at the edge of STI regions may exhibit significantly reduced contact surface areas.

As shown in FIG. 2, raised S/D region 202 has a reduced contact surface area Sf1 relative to the contact surface area provided by S/D region 220. Likewise, raised S/D regions 204 and 206 have significantly reduced contact surface areas Sf2 and Sf3 compared to the contact surface area provided by S/D region 220. In the illustrated structure 220, since the STI regions 208, 210 are formed on an extremely thin silicon-on-insulator (ETSOI) layer 222 located on a buried oxide (BOX) layer 224, the shallow STI regions 208, 210 facilitate the formation of pronounced facets such as facets 212-216.

It may, therefore, be advantageous, among other things, to control the formation of facets during the growth of epitaxial regions within semiconductor structures.

BRIEF SUMMARY

According to at least one exemplary embodiment, a method of forming a semiconductor structure includes providing an active layer and forming adjacent gate structures on the active layer. The gate structures each have sidewalls such that first spacers are formed on the sidewalls. A raised region is epitaxially grown on the active layer between the adjacent gate structures and at least one trench that extends through the raised region and through the active region is formed, whereby the at least one trench separates the raised region into a first raised region corresponding to a first transistor and a second raised region corresponding to a second transistor. The first raised region and second raised region are electrically isolated by the at least one trench.

According to another exemplary embodiment, a method of forming a semiconductor structure includes providing an active layer and forming gate structures on the active layer, whereby the gate structures each have sidewalls. First spacers are formed on the sidewalls of the gate structures. At least one raised source/drain epitaxial region is formed over the active layer in the exposed regions not covered by the gate structures and the first spacers, such that the source/drain epitaxial region includes controllably formed facets at locations adjacent the gate structures. At least one trench that extends into both the raised source/drain epitaxial region and a predetermined location of the active region underlying the source/drain epitaxial region is formed. The trench separates the raised source/drain epitaxial region into a first raised source/drain epitaxial region corresponding to a first transistor and a second raised source/drain epitaxial region corresponding to a second transistor, whereby the first raised source/drain epitaxial region and second raised source/drain epitaxial region are electrically isolated by the formed trench.

According to another exemplary embodiment, a semiconductor structure includes an active layer located on a substrate and a first and a second gate structure located on the active layer. A first raised epitaxial region is located on the active layer between the first and the second gate structure. The first raised epitaxial region has a first facet shaped edge and a first vertical shape edge, such that the first facet shaped edge is located adjacent the first gate structure. A second raised epitaxial region is also located on the active layer between the first and the second gate structure. The second raised epitaxial region has a second facet shaped edge and a second vertical shape edge, such that the second facet shaped edge is located adjacent the second gate structure. A trench region is located between the first and the second vertical shaped edge for electrically isolating the first and the second raised epitaxial region.

According to yet another exemplary embodiment, a design structure tangibly embodied in a machine readable medium for designing, manufacturing, or testing an integrated circuit is provided. The design structure includes an active layer located on a substrate and a first and a second gate structure located on the active layer. A first raised epitaxial region is located on the active layer between the first and the second gate structure. The first raised epitaxial region has a first facet shaped edge and a first vertical shape edge, such that the first facet shaped edge is located adjacent the first gate structure. A second raised epitaxial region is also located on the active layer between the first and the second gate structure. The second raised epitaxial region has a second facet shaped edge and a second vertical shape edge, such that the second facet shaped edge is located adjacent the second gate structure. A trench region is located between the first and the second vertical shaped edge for electrically isolating the first and the second raised epitaxial region.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following described and illustrated semiconductor structures and methods provide the desired faceting of epitaxially grown regions at gate structure edges, while eradicating undesirably formed facets that may occur at the edges of isolation regions.

Figure 3A:
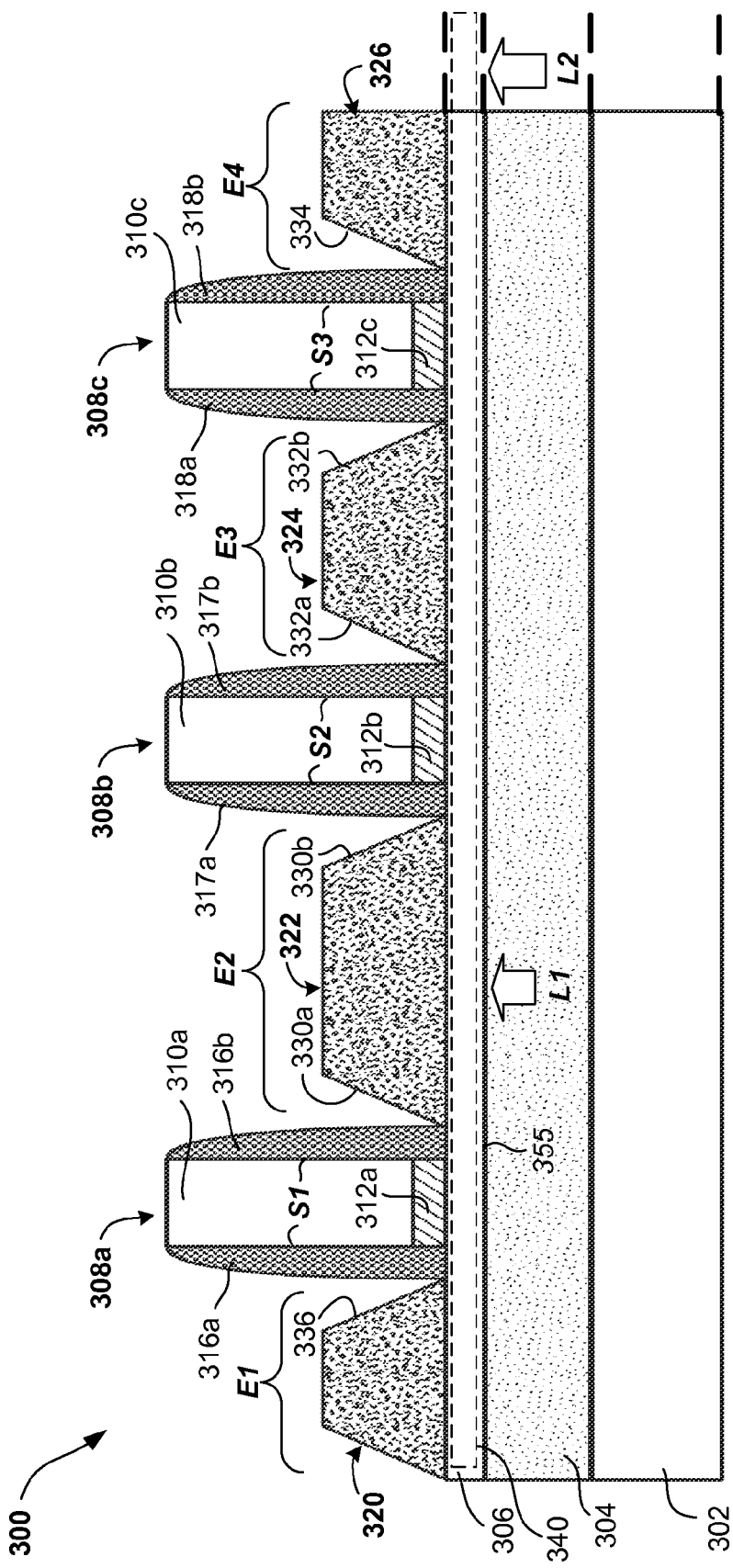
FIGS. 3A-3E are cross sectional views of a semiconductor structure according to an embodiment of the invention.

FIGS. 3A-3E are cross sectional views of a semiconductor structure formed according to an embodiment of the invention. Referring to FIG. 3A, semiconductor structure 300 includes a substrate layer 302, a buried oxide layer 304 formed on top of the substrate 302, and an extremely thin silicon-on-insulator (ETSOI) layer 306 formed on top of the buried oxide (BOX) layer 304. The thickness of the substrate may be approximately 875 μm, while the BOX 304 may have a thickness of about 145 nm. The ETSOI layer 306 may have a thickness of less than 10 nm, preferably about 6 nm.

Gate structures 308a-308c may be created using conventional gate patterning and formation processes, whereby each gate structure may include a gate electrode and a gate dielectric layer formed over the ETSOI layer 306. For example, gate structure 308a may include gate electrode 310a and gate dielectric layer 312a. Gate structure 308b may include gate electrode 310b and gate dielectric layer 312b, while gate structure 308c may include gate electrode 310c and gate dielectric layer 312c.

Gate dielectric layers 312a-312c may include a high-k dielectric material having a dielectric constant greater than, for example, 3.9, which is the dielectric constant of silicon oxide. The high-k dielectric material may include a dielectric metal oxide. In some implementations, a high-k material that has a dielectric constant in the range of about 4.0-8.0 may be utilized. Exemplary high-k dielectric materials may include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, or $Y_2O_xN_y$. In other implementations, a silicon nitride ($Si_3N_4$) dielectric having a dielectric constant of about 7.5 may be used as a gate dielectric. Gate dielectric layers 312a-312c may also include a multi-layer of $SiO_2$, SiON, SiN, and a high-k dielectric material, including but not limited, to hafnium oxide ($HfO_2$), aluminum oxide ($Al_2O_3$), lanthanum oxide ($La_2O_3$), zirconium oxide ($ZrO_2$), and their respective silicates. The thickness of the gate dielectric 304 may be in the range of 1.0 nm-5.0 nm. The gate electrodes 310a-310c may include metals such as TiN, TaN, W, WN, TaAlN, Al, Au, Ag, or a combination of such metals. Gate electrodes 310a-310c may also include a poly-silicon layer located on top of a metal material, whereby the top of the poly-silicon layer may be silicided. Gate electrodes 310a-310c may have a thickness approximately in the range of 20-100 nm and a length in the range of about 10-250 nm, although lesser and greater thicknesses and lengths may also be contemplated.

Once the gate structures 308a-308c are formed, first spacers 316-318 are formed on the sidewalls of gate structures 308a-308c, respectively. As illustrated, spacers 316a and 316b are formed on the sidewalls S1 of gate structure 308a, spacers 317a and 317b are formed on the sidewalls S2 of gate structure 308b, and spacers 318a and 318b are formed on the sidewalls S3 of gate structure 308c. The gate spacers 316-318 are formed on the sidewalls S1-S3 of the gate structures 308a-308c by deposition of a dielectric layer. The dielectric layer may be formed, for example, by chemical vapor deposition (CVD) of a dielectric material. For example, the dielectric materials used to form gate spacers 316-318 may include silicon oxide, silicon nitride, or silicon oxynitride.

Following the formation of the gate structures 308a-308c and the first spacers 316-318, raised source/drain (S/D) regions 320, 322, 324, 326 can be epitaxially grown in a self-aligned manner in the exposed areas E1-E4 of the underlying ETSOI layer 306. Thus, the raised source/drain (S/D) regions 320, 322, 324, 326 are grown in the regions E1-E4 not covered by the formed gate structures 308a-308c and their respective first spacers 316-318.

For example, for a pFET finFET device, epitaxially grown raised S/D regions such as S/D regions 320, 322, 324, and 326 may include a silicon germanium (SiGe) type material, where the atomic concentration of germanium (Ge) may range from about 10-80%, preferably from about 20-60%. In a preferred exemplary embodiment, the concentration of germanium (Ge) may be 50%. SiGe provides a compressive strain. Dopants such as boron may be incorporated into the SiGe S/D regions by in-situ doping. The percentage of boron may range from $1E19\ cm^{-3}$ to $2E21\ cm^{-3}$, preferably from about $2E20\ cm^{-3}$ to $7E20\ cm^{-3}$.

For example, for a nFET finFET device, epitaxially grown S/D raised regions such as S/D regions 320, 322, 324, and 326 may include a carbon doped Silicon (Si:C) type material, where the atomic concentration of carbon (C) may range from about 0.4-4.0%, preferably from about 0.5-2.8%. In a preferred exemplary embodiment, the concentration of carbon (C) may be approximately 1.5-2.2%. Si:C provides a tensile strain. Dopants such as phosphorous or arsenic may be incorporated into the Si:C S/D regions by in-situ doping. The percentage of phosphorous or arsenic may range from $1E19\ cm^{-3}$ to $2E21\ cm^{-3}$, preferably from about $2E20\ cm^{-3}$ to $7E20\ cm^{-3}$. For both nFET and pFET devices, doping the epitaxially grown S/D raised regions 320, 322, 324, 326 may facilitate, among other things, the creation of better contacts.

As depicted in FIG. 3A, the epitaxial growth of the raised source/drain (S/D) regions 320-326 adjacent the gate structures 308a-308c and their respective spacers 316-318 create facets at the edges of the gate structures 308a-308c. For example, raised S/D region 322 includes facets 330a and 330b at the edge of gate structures 308a and 308b, respectively. Also, for example, raised S/D region 324 includes facets 332a and 332b at the edge of gate structures 308b and 308c, respectively. The occurrence of the gate edge facets 330, 332, 334, 336, which are created by the epitaxially grown raised source/drain (S/D) regions 320, 322, 324, 326, provide a reduction in parasitic capacitance and, therefore, electrical cross-talk between the gate structures 308a-308c and the raised source/drain (S/D) regions 320, 322, 324, 326. The facet inclinations or angles are created by controlling the crystal growth conditions (e.g., temperature, pressure, and precursor gases) of the epitaxial growth process of the raised source/drain (S/D) regions 320, 322, 324, 326. By controlling such growth conditions, controlled facets 330, 332, 334, and 336 may be formed by the 111-planes (e.g., approximately 54° facets) of the crystalline structure of the epitaxially grown raised source/drain (S/D) regions 320, 322, 324, 326. Facets formed by 113-planes (e.g., approximately 57° facets) and 115-planes (e.g., approximately 60° facets) may also be contemplated.

The extremely thin silicon-on-insulator (ETSOI) layer 306 formed on top of the buried oxide (BOX) layer 304 may form an active layer 340 of the semiconductor structure 300. The active layer 340 may include the silicon area corresponding to the extremely thin silicon-on-insulator (ETSOI) layer 306 that is used to fabricate active devices such as, for example, nFET and pFET device structures. As depicted, the active layer 340 is the area upon which the gate structures 308a-308c and their respective channels, and the raised source/drain (S/D) regions 320-326 are formed.

Figure 3B:
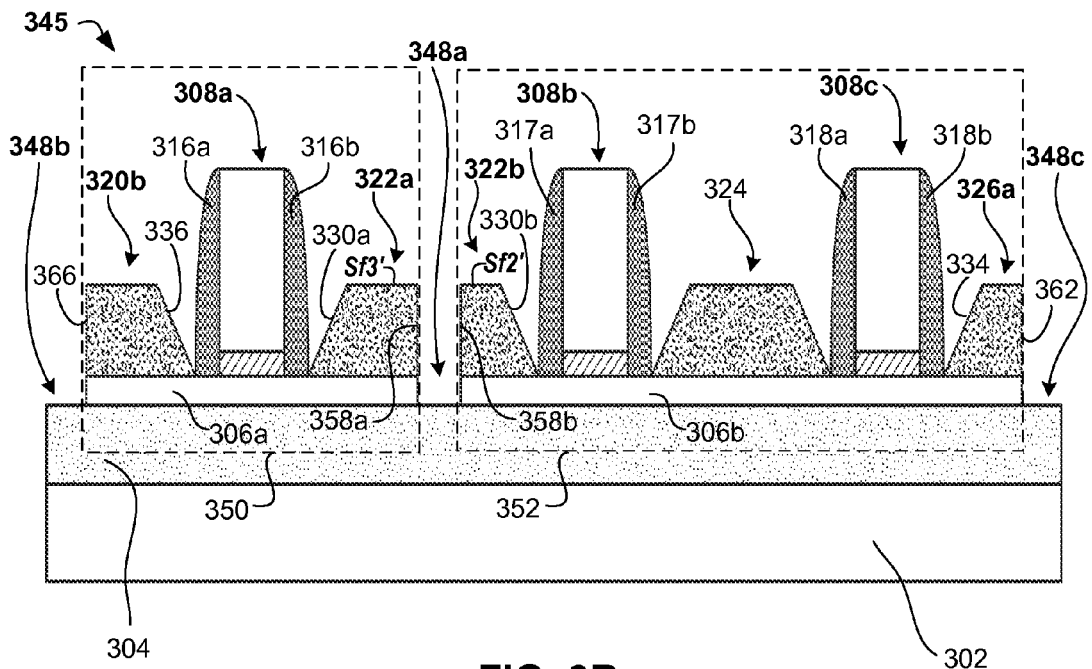

FIG. 3B is a cross sectional view of a resulting semiconductor structure 345 following the photolithographic patterning and etching of the active layer 340 (FIG. 3A) of semiconductor structure 300 (FIG. 3A). As illustrated, an active layer mask (RX mask) may be utilized to pattern and etch predefined regions of the extremely thin silicon-on-insulator (ETSOI) layer 306 (FIG. 3A). For example, according to this embodiment, the patterning and etching (e.g., RIE: Reactive Ion Etching) of the extremely thin silicon-on-insulator (ETSOI) layer 306 simultaneously not only defines the active regions 306a, 306b of the active layer 340 (FIG. 3A) of semiconductor structure 300 (FIG. 3A), but also forms trench regions 348a-348c that electrically isolate devices 350 and 352. Thus, based on the application of the RX mask, device 350 is formed on defined active region 306a, while device 352 is formed on defined active region 306b, whereby both devices 350, 352 are electrically isolated from each other via trench 348a.

For example, by etching trench 348a at a predetermined location L1 (FIG. 3A) of the active layer 340 (FIG. 3A) corresponding to raised source/drain (S/D) region 322 (FIG. 3A), the raised source/drain (S/D) region 322 (FIG. 3A) is divided into raised source/drain (S/D) regions 322a and 322b, which are thereby electrically isolated from each other. Similarly, by etching trench 348c at another predetermined location L2 (FIG. 3A) of the active layer 340 (FIG. 3A) corresponding to raised source/drain (S/D) region 326 (FIG. 3A), the raised source/drain (S/D) region 326 (FIG. 3A) can be divided into raised source/drain (S/D) regions 326a and a second S/D region (not shown), which are also electrically isolated from each other.

Accordingly, the active layer 340 (FIG. 3A) can be defined into active regions 306a and 306b of devices 350 and 352, respectively, by forming an isolation trench (i.e., trench: 348a). By electrically isolating device structures according to this embodiment after epitaxial growth of the S/D regions 320, 322, 324, 326, rather than before, the formation of STI regions and corresponding facet problems associated with epitaxial growth processes at the edge of these STI regions may be avoided. Although for brevity only exemplary devices 350 and 352 are shown, other devices may also be fabricated which may require electrical isolation. For example, another gate 308d (not shown) may be formed. Raised source/drain (S/D) region 326 (FIG. 3A) may be formed between gate 308c and gate 308d (not shown). As depicted in FIG. 3B, trench 348c may divide the raised source/drain (S/D) region 326 (FIG. 3A) into raised source/drain (S/D) region 326a and a second S/D region (not shown), and thereby separate device 352 from gate 308d. Similarly, trench 348b may isolate device 350 from an adjacent device (not shown) located to the left of device 350. The electrical isolation provided by the trenches (e.g., trench 348a: FIG. 3B) stems from the etching process going down through both the raised source/drain (S/D) regions (e.g., S/D region 322: FIG. 3A) and the extremely thin silicon-on-insulator (ETSOI) layer 306 (FIG. 3A) to at least the surface 355 (FIG. 3A) of the BOX layer 304. Going down further into the BOX layer 304 beyond surface 355 may also be contemplated.

As depicted, based on the formation of trench 348a, sidewalls 358a and 358b of epitaxial raised source/drain (S/D) regions 322a and 322b, respectively, may be substantially vertical. In addition, controlled facets 330a and 330b provide the desired reduction in parasitic capacitance with their respective gates 308a, 308b. Thus, isolation may be provided without the creation of facetted epitaxial raised source/drain (S/D) regions (e.g., see FIG. 2) at the edge of the trench 348a, while maintaining the benefits of forming controlled facets 330a, 330b at the gate 308a, 308b edges. Similarly, based on the formation of trench 348c, sidewall 362 of epitaxial raised source/drain (S/D) region 326a may be substantially vertical. In addition, controlled facet 334 provides the desired reduction in parasitic capacitance with gate 308c. Thus, isolation may be provided without the creation of facetted epitaxial raised source/drain (S/D) regions (e.g., see FIG. 2) at the edge of the trench 348c, while maintaining the benefits of forming controlled facet 334 at the edge of gate 308c. Also, based on the formation of trench 348b, sidewall 366 of epitaxial raised source/drain (S/D) region 320b may be substantially vertical. In addition, controlled facet 336 also provides the desired reduction in parasitic capacitance with gate 308a. Thus, isolation may be provided without the creation of facetted epitaxial raised source/drain (S/D) regions (e.g., see FIG. 2) at the edge of the trench or isolation region 348b, while maintaining the benefits of forming controlled facet 336 at the edge of gate 308a.

Figure 1A:
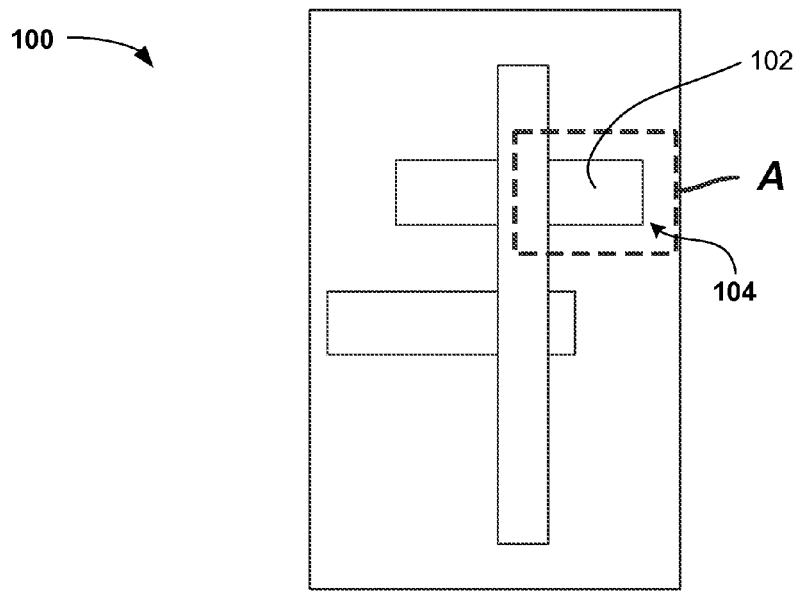
FIGS. 1A-1B are plan views of a semiconductor structure depicting facet formation due to epitaxially growing a raised S/D region at the edge of a shallow trench isolation (STI) region, as known in the art.
Figure 1B:
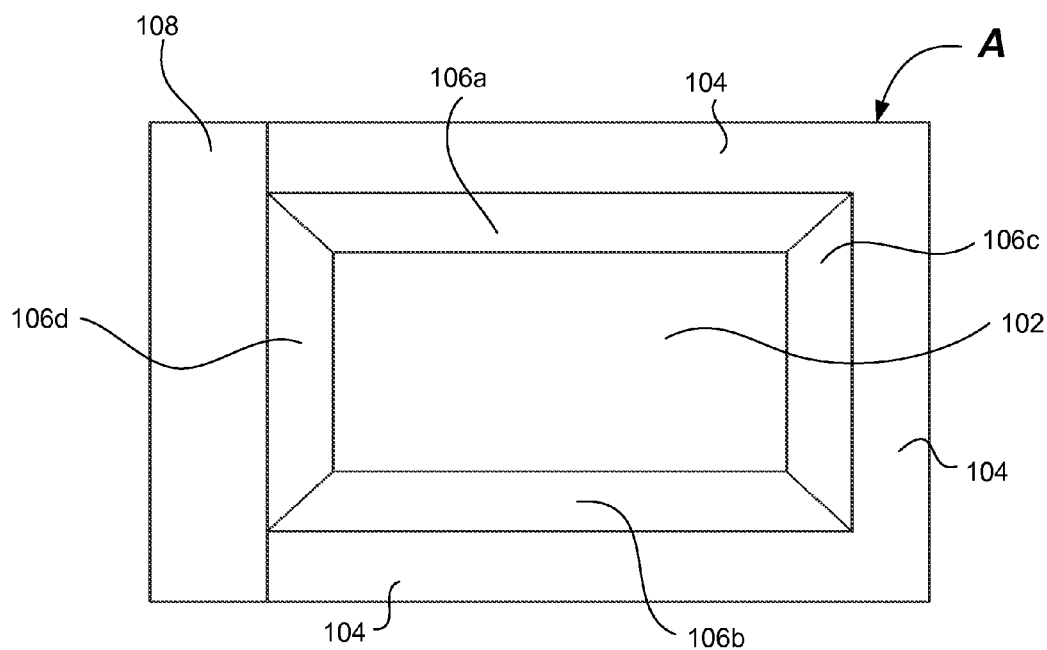
Figure 2:
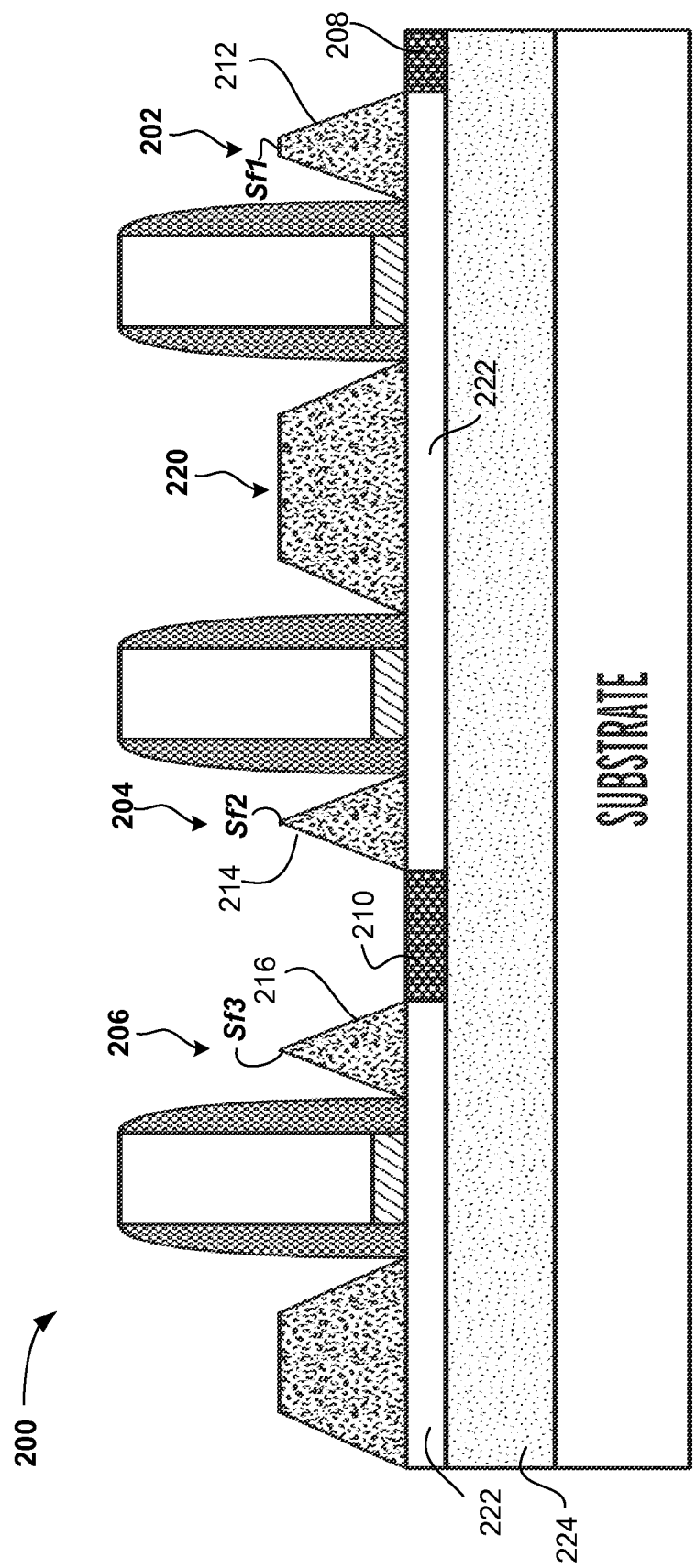
FIG. 2 is a cross sectional view of a semiconductor structure illustrating facet formation based on the epitaxial growth of raised S/D regions at the edge of shallow trench isolation (STI) regions, as known in the art.

As depicted in FIG. 3B, the vertical sidewalls of the epitaxial raised source/drain (S/D) regions at the edge of the trenches provide an increased contact surface area relative to epitaxial raised source/drain (S/D) regions formed at the edge of STI regions, as shown in FIG. 2. For example, the surface area Sf2 (FIG. 2) of raised source/drain (S/D) region 204 (FIG. 2) may be substantially smaller in comparison to the surface area Sf2' of raised source/drain (S/D) region 322b. Also, for example, the surface area Sf3 (FIG. 2) of raised source/drain (S/D) region 206 (FIG. 2) may be substantially smaller in comparison to the surface area Sf3' of raised source/drain (S/D) region 322a.

Figure 3C:
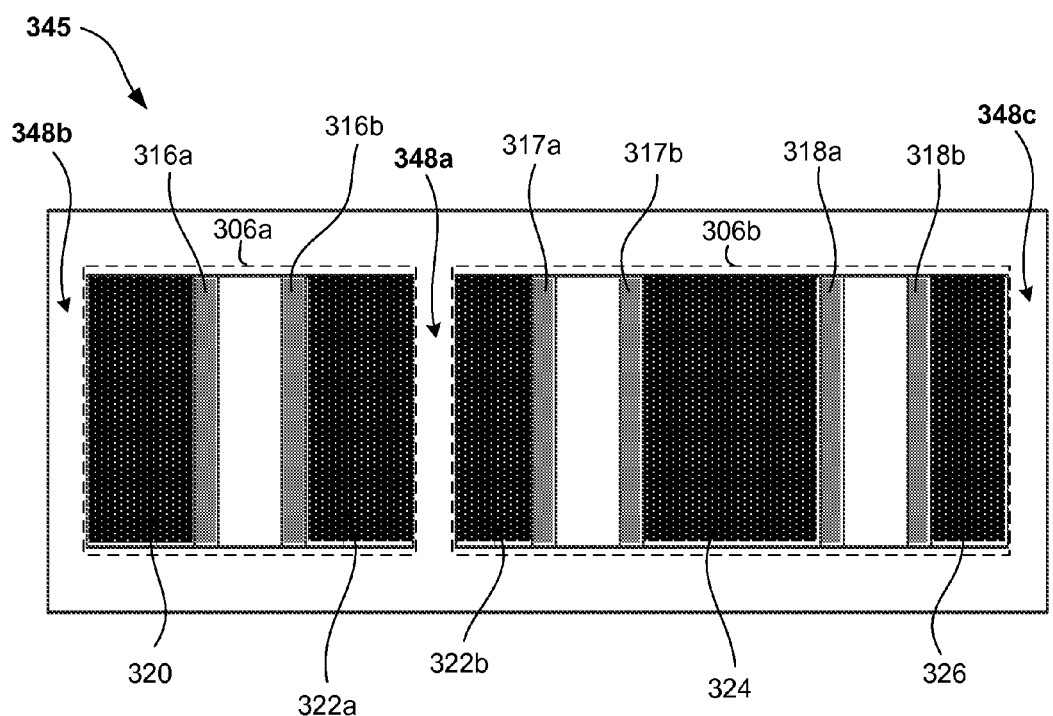

FIG. 3C is a plan view of the semiconductor structure 345 shown in FIG. 3B. As illustrated, the active layer 340 (FIG. 3A) RX mask defines active regions 306a and 306b of devices 350 and 352, respectively, while simultaneously facilitating the formation of requisite trenches 348a-348c for not only electrically isolating devices 350 and 352 from one another, but also other fabricated neighboring devices (not shown).

Figure 3D:
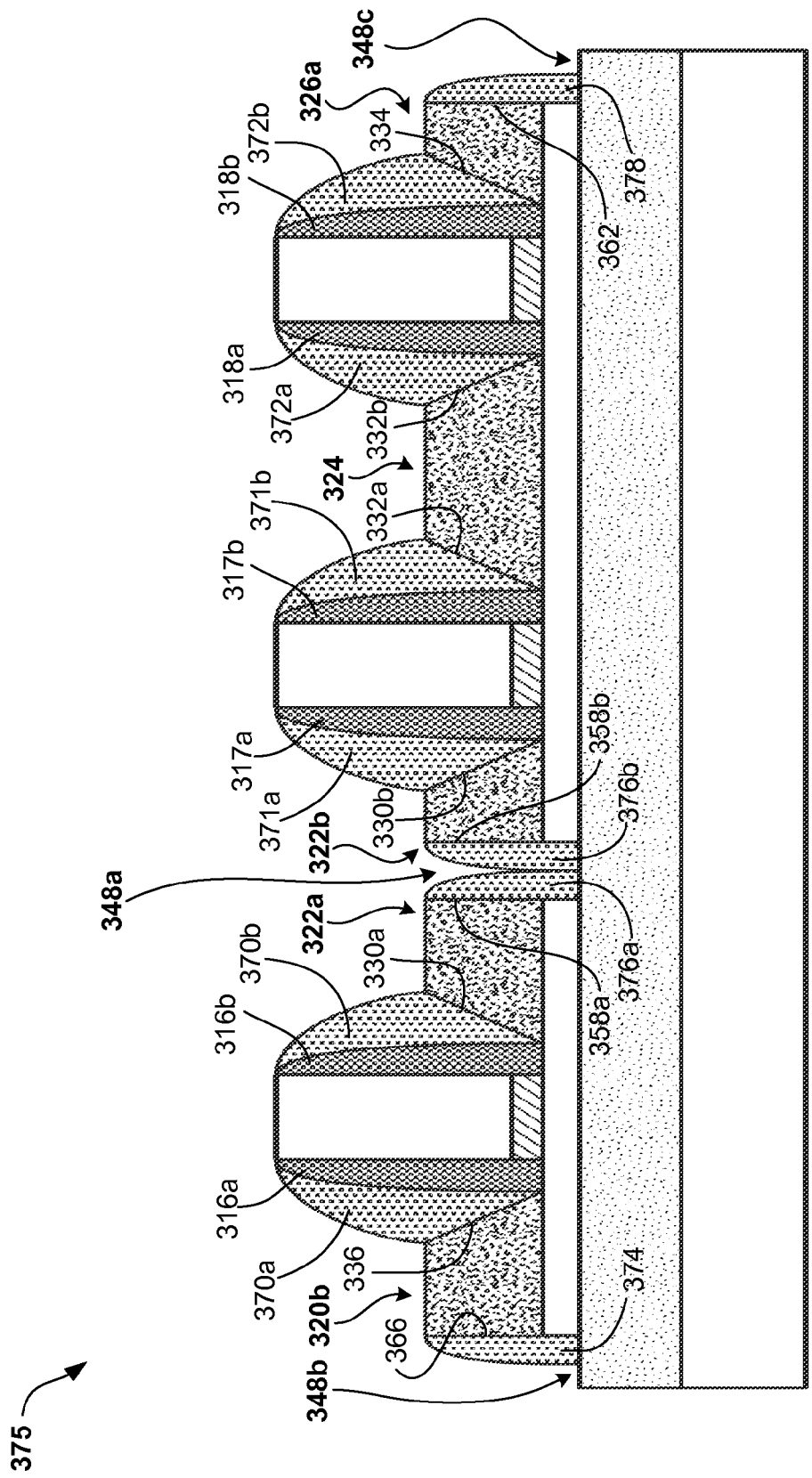

Referring to the semiconductor structure 375 of FIG. 3D, a set of second spacers are deposited with respect to the structure 345 of FIG. 3B. For example, second spacers 370a and 370b may be formed over respective first spacers 316a-316b, second spacers 371a and 371b may be formed over respective first spacers 317a-317b, and second spacers 372a and 372b may be formed over respective first spacers 318a-318b. Additionally, second spacers 370a and 370b may be formed over respective facets 336 and 330a, while second spacers 371a and 371b may be formed over respective facets 330b and 332a. Also, second spacers 372a and 372b may be formed over respective facets 332b and 334. As illustrated, second spacers are also created in the formed trenches. For example, second spacer 374 may be formed within trench 348b on sidewall 366 of epitaxial raised source/drain (S/D) region 320b. Second spacers 376a and 376b may be formed within trench 348a on respective sidewalls 358a and 358b of epitaxial raised source/drain (S/D) regions 322a and 322b. Also, second spacer 378 may be formed within trench 348c on sidewall 362 of epitaxial raised source/drain (S/D) region 326a.

As with the first spacers 316-318, the second spacers are created by deposition of a dielectric layer, whereby the dielectric layer may be formed, for example, by chemical vapor deposition (CVD) of a dielectric material. For example, the dielectric materials used to form second spacers 370-372, 374, 376, and 378 may include silicon oxide, silicon nitride, or silicon oxynitride.

Figure 3E:
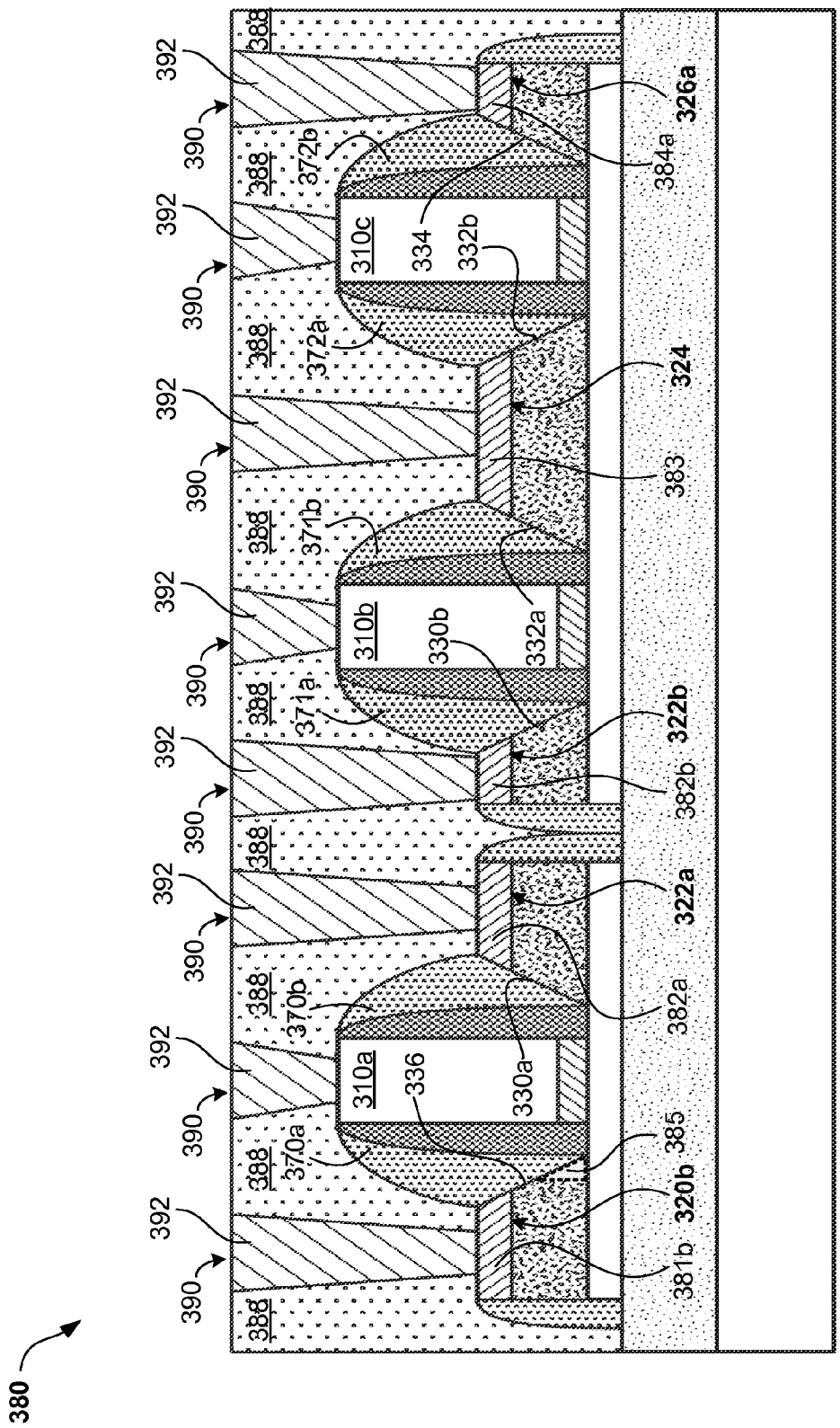

In accordance with the embodiment depicted in FIG. 3D, the controllably formed facets 336, 330a, 330b, 332a, 332b, 334 may be protected by the second spacers 370a, 370b, 371, 371, 372, 372 that are formed over them for the purpose of subsequent silicide formation processes associated with the epitaxial raised source/drain (S/D) regions 320b, 322a, 322b, 324, 326a (see FIG. 3E).

Referring to FIG. 3E, silicide and contact formation processes are carried out on structure 375 of FIG. 3D. As shown, FIG. 3E, structure 380 includes silicide areas 381b, 382a, 382b, 383, and 384a that are respectively formed over the top surfaces of epitaxial raised source/drain (S/D) regions 320b, 322a, 322b, 324, and 326a. Silicide may be formed by depositing a metal liner material such as nickel over structure 375 (FIG. 3D), followed by a thermal anneal process (e.g., approximate 450° C.). Based on this process, nickel silicide is formed on the semiconductor material surfaces of the epitaxial raised source/drain (S/D) regions 320b, 322a, 322b, 324, 326a. Consequently, silicide areas 381b, 382a, 382b, 383, and 384a may, for example, be formed from nickel silicide. In contrast, silicide is not formed over the oxide materials of second spacers 370-372. Thus, the remaining nickel metal liner material not forming the silicide may be subsequently removed from these areas prior to contact (CA) formation.

During silicide formation, a portion of the underlying silicon is consumed. For example, during the formation of silicide areas 381b, 382a, 382b, 383, and 384a, a portion of the top surfaces of respective epitaxial raised source/drain (S/D) regions 320b, 322a, 322b, 324, and 326a is consumed. However, as depicted, the second spacers 370-372 cover the surfaces of the facets 336, 330a, 330b, 332a, 332b, 334 corresponding to their respective raised source/drain (S/D) regions 320b, 322a, 322b, 324, 326a. For example, spacer 370a covers the surface of facet 336 corresponding to raised source/drain (S/D) region 320b, spacer 370b covers the surface of facet 330a corresponding to raised source/drain (S/D) region 322a, spacer 371a covers the surface of facet 330b corresponding to raised source/drain (S/D) region 322b, spacers 371b and 372a cover the surfaces of respective facet 332a and 332b corresponding to raised source/drain (S/D) region 324, and spacer 372b covers the surface of facet 334 corresponding to raised source/drain (S/D) region 326a. By covering the facets 336, 330a, 330b, 332a, 332b, 334 using the second spacers 370-372, the surfaces of the facets 336, 330a, 330b, 332a, 332b, 334 are not exposed to and, therefore, protected from the silicide formation process.

If during the silicide process, the facetted areas are exposed, as silicide is formed on the facet, the underlying epitaxially grown S/D material (e.g., SiGe) may be consumed. Consumption of the underlying epitaxially grown S/D material at the facet may effect dopant concentration near the channel and subsequently lead to device operation failure or poor device (e.g., nFET, pFET, etc.) performance. This may particularly apply to regions of the facet where the epitaxially grown S/D material becomes thinner (i.e., near the gate edge). For example, if silicide is formed on facet 336 of raised source/drain (S/D) region 320b, the thinner epitaxial region 385 of the raised source/drain (S/D) region 320b may be consumed, which may adversely effect dopant concentrations in region 385. This rationale applies to the formation of silicide on remaining facets 330a, 330b, 332a, 332b, and 334.

As further depicted in FIG. 3E, a contact (CA) dielectric material layer such as silicon oxide or silicon nitride may be deposited, patterned and etched. Dielectric regions 388 are the result of such deposition, photolithographic patterning, and etching processes. As shown, for the contact formation processes, the contact (CA) dielectric material layer (not shown) may be patterned in order to align the contact (CA) regions 390 with both the silicide covered portions of the raised source/drain (S/D) regions 320b, 322a, 322b, 324, 326a and the gate electrodes 310a-310c. Once formed, the contact regions 390 may be filed with an electrically conductive material such as tungsten in order to create contacts 392.

Figure 4A:
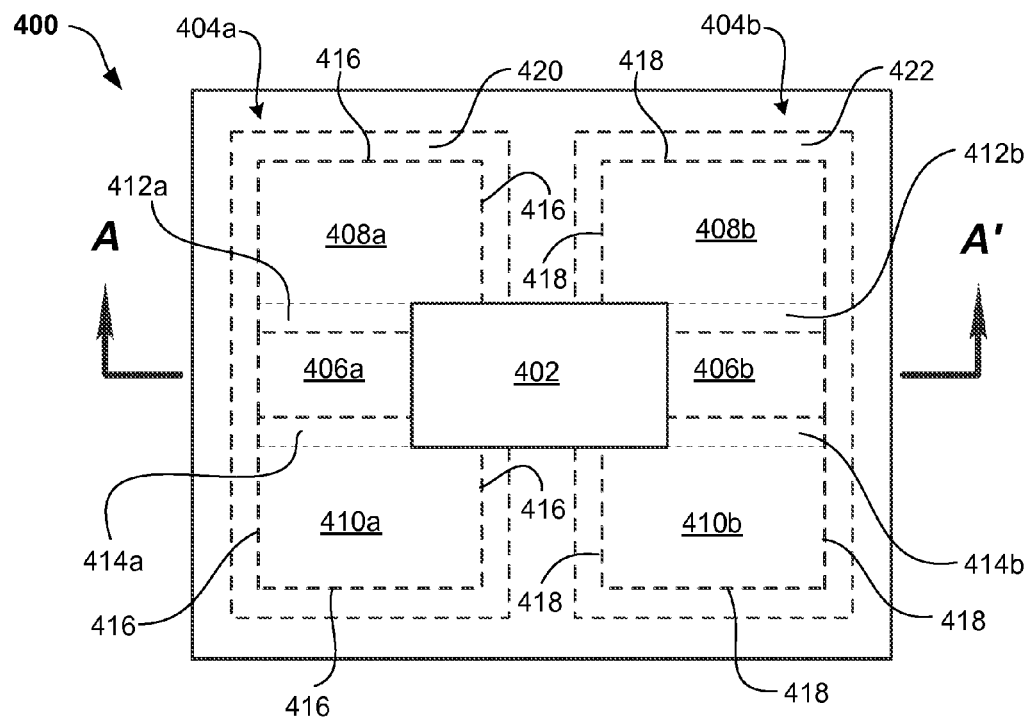
FIGS. 4A-4B are cross sectional views depicting a contact for connecting multiple semiconductor structures according to an embodiment of the present invention.
Figure 4B:
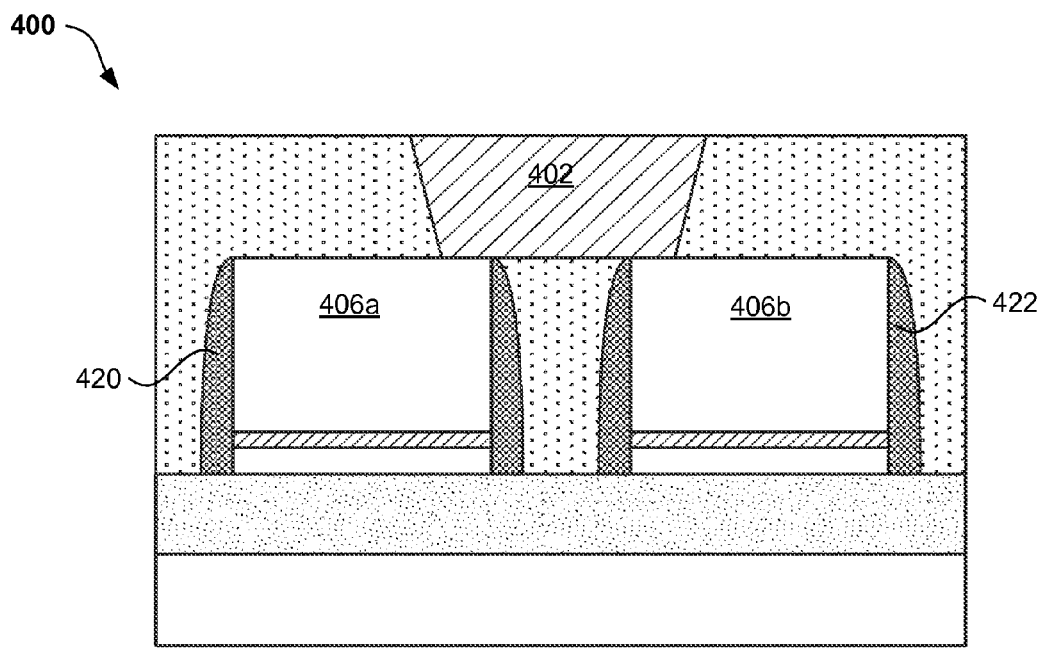

FIGS. 4A and 4B illustrate a semiconductor structure 400 that includes a contact strap 402 that connects two individual transistor devices 404a, 404b. FIG. 4B depicts a cross sectional view (along A-A') of the semiconductor structure 400. Contact strap 402 connects to both gate structure 406a of device 404a and gate structure 406b of device 404b. As with the previously described and illustrated embodiment depicted in FIGS. 3A-3E, the embodiment of FIGS. 4A-4B includes desired facets along their gate edges. For example, raised source/drain (S/D) region 408a of device 404a includes a desired facetted shape along gate edge region 412a. Also, raised source/drain (S/D) region 410a of device 404a includes a desired facetted shape along gate edge region 414a. Similarly, raised source/drain (S/D) region 408b of device 404b includes a desired facetted shape along gate edge region 412b. Also, raised source/drain (S/D) region 410b of device 404b includes a desired facetted shape along gate edge region 414b. Along the active layer (RX)

border of device 404a, as defined by 416, no facets corresponding to raised source/drain (S/D) regions 408a and 410a are desirably formed based on the above-described embodiments. Similarly, along the active layer (RX) border of device 404b, as defined by 418, there also no facets corresponding to raised source/drain (S/D) regions 408b and 410b. Spacer material 420 is, however, formed on the substantially vertical shaped (not shown) raised source/drain (S/D) regions 408a, 410a along border 416 of device 404a. Likewise, spacer material 422 is also formed on the substantially vertical shaped raised source/drain (S/D) regions 408b, 410b along border 418 of device 404b.

Figure 5:
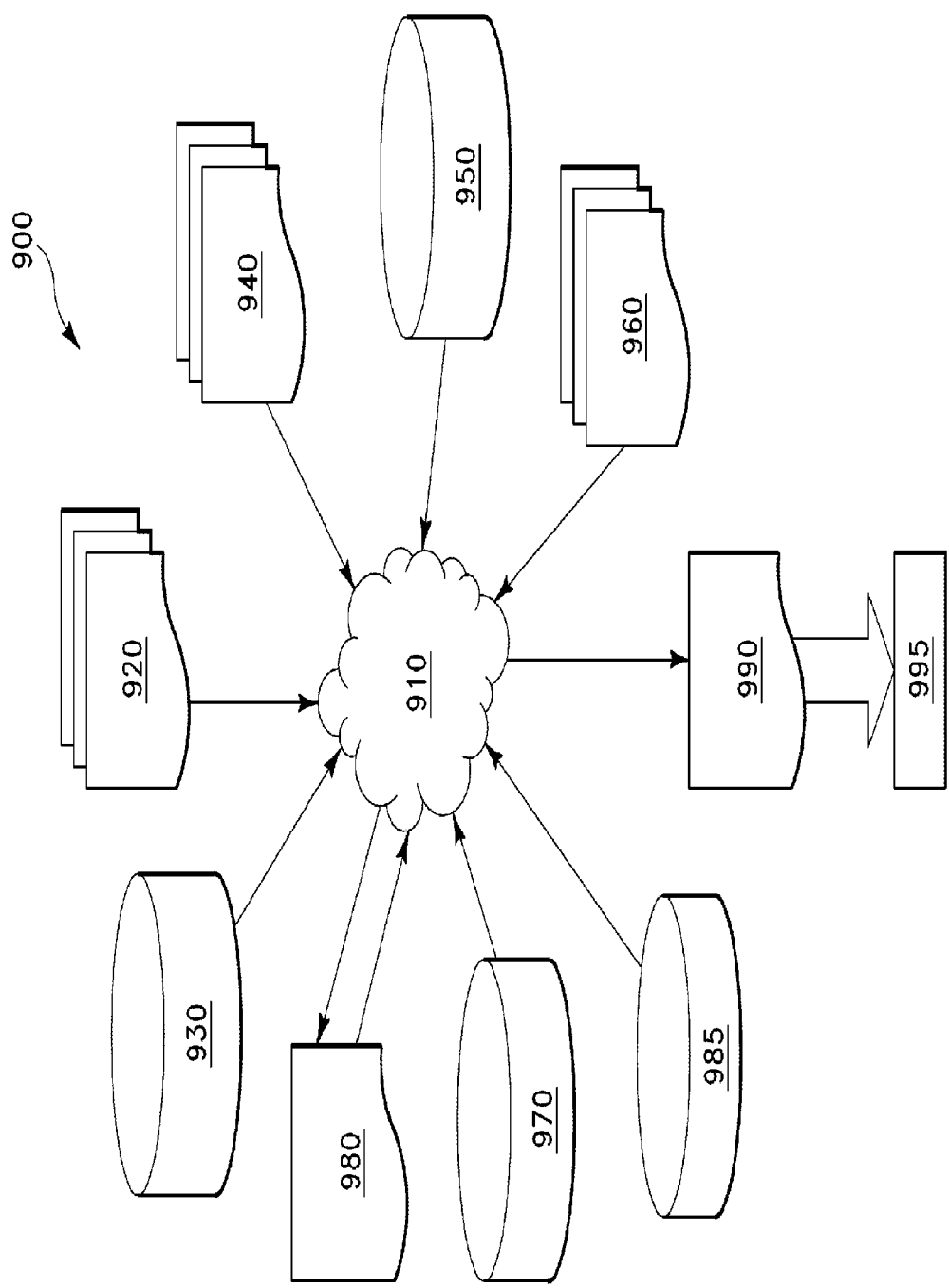
FIG. 5 is a flow diagram of a design process used in semiconductor design, manufacture, and/or test.

FIG. 5 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 3E & 4A. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. In one embodiment, the design structure 920 comprises design data used in a design process and comprising information describing one or more embodiments of the invention with respect to the structures as shown in FIGS. 3E & 4A. The design data in the form of schematics or HDL, a hardware-description language (e.g., Verilog, VHDL, C, etc.) may be embodied on one or more machine readable media. For example, design structure 920 may be a text file, numerical data or a graphical representation of the one or more embodiments of the invention, as shown in FIGS. 3E & 4A. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 3E & 4A. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3E & 4A to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3E & 4A. In one embodiment, design structure 990 may comprise a compiled, executable HDL simulation model that functionally simulates the devices shown in FIGS. 3E & 4A.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 3E & 4A. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
a substrate;
an isolation layer on the substrate;
an active layer on the isolation layer;
a first gate structure and a second gate structure located on the active layer;
a raised epitaxial layer on the active layer between the first gate structure and the second gate structure;
a trench extending vertically through the raised epitaxial layer and the active layer such that the trench has a bottom comprising a portion of the isolation layer and such that the raised epitaxial layer comprises:
a first raised epitaxial region located on the active layer between the first gate structure and the trench, the first raised epitaxial region having a first facet shaped edge adjacent to the first gate structure and a first vertical shaped edge opposite the first facet shaped edge; and,
a second raised epitaxial region located on the active layer between the trench and the second gate structure, the second raised epitaxial region having a second facet shaped edge adjacent to the second gate structure and a second vertical shaped edge opposite the second facet shaped edge; and,
trench sidewall spacers within the trench and comprising:
a first trench sidewall spacer on the portion of the isolation layer at the bottom of the trench and positioned laterally immediately adjacent to a first sidewall of the trench so as to be positioned laterally immediately adjacent to the active layer and the first vertical shaped edge of the first raised epitaxial region; and,
a second trench sidewall spacer on the portion of the isolation layer at the bottom of the trench and positioned laterally immediately adjacent to a second sidewall of the trench opposite the first sidewall so as to be positioned laterally immediately adjacent to the active layer and the second vertical shaped edge of the second raised epitaxial region,
the trench sidewall spacers comprising remaining vertical portions of a deposited and etched dielectric layer.

2. The semiconductor structure of claim 1, the first raised epitaxial region corresponding to a first transistor device and the second raised epitaxial region corresponding to a second transistor device.

3. The semiconductor structure of claim 1, the active layer comprising an extremely thin silicon-on-insulator layer.

4. The semiconductor structure of claim 1, further comprising:
first gate sidewall spacers located on opposing sidewalls of both the first gate structure and the second gate structure; and,
second gate sidewall spacers located on the first gate sidewall spacers,
the second gate sidewall spacers filling spaces between the first gate sidewall spacers and the first facet shaped edge of the first raised epitaxial region adjacent to the first gate structure and the second facet shaped edge of the second raised epitaxial region adjacent to the second gate structure.

5. The semiconductor structure of claim 4, the first gate sidewall spacers, the second gate sidewall spacers and the trench sidewall spacers comprising the same dielectric materials.

6. The semiconductor structure of claim 4, the second gate sidewall spacers and the trench sidewall spacers comprising the same dielectric materials.

7. The semiconductor structure of claim 4, further comprising silicide layers on the first raised epitaxial region and the second raised epitaxial region extending between the second gate sidewall spacers and the trench sidewall spacers.

8. A semiconductor structure comprising:
a substrate;
an isolation layer on the substrate;
an active layer on the isolation layer;
a first gate structure and a second gate structure on the active layer;
a raised epitaxial layer on the active layer between the first gate structure and the second gate structure;
a trench extending vertically through the raised epitaxial layer and the active layer such that the trench has a bottom comprising a portion of the isolation layer and such that the raised epitaxial layer comprises:

a first raised epitaxial region located on the active layer between the first gate structure and the trench, the first raised epitaxial region having a first facet shaped edge adjacent to the first gate structure and a first vertical shaped edge opposite the first facet shaped edge; and, a second raised epitaxial region located on the active layer between the trench and the second gate structure, the second raised epitaxial region having a second facet shaped edge adjacent to the second gate structure and a second vertical shaped edge opposite the second facet shaped edge;

silicide layers on the raised epitaxial layer, the silicide layers comprising:
  a first silicide layer on the first raised epitaxial region; and
  a second silicide layer on the second raised epitaxial region; and, trench sidewall spacers within the trench and comprising:
  a first trench sidewall spacer on the portion of the isolation layer at the bottom of the trench and positioned laterally immediately adjacent to a first sidewall of the trench so as to be positioned laterally immediately adjacent to the active layer, the first vertical shaped edge of the first raised epitaxial region, and the first silicide layer; and,
  a second trench sidewall spacer on the portion of the isolation layer at the bottom of the trench and positioned laterally immediately a second sidewall of the trench opposite the first sidewall so as to be positioned laterally immediately adjacent to the active layer, the second vertical shaped edge of the second raised epitaxial region and the second silicide layer, the trench sidewall spacers comprising remaining vertical portions of a deposited and etched dielectric layer.

9. The semiconductor structure of claim 8, the first raised epitaxial region corresponding to a first transistor device and the second raised epitaxial region corresponding to a second transistor device.

10. The semiconductor structure of claim 8, the active layer comprising an extremely thin silicon-on-insulator layer.

11. The semiconductor structure of claim 8, further comprising:
  first gate sidewall spacers located on opposing sidewalls of both the first gate structure and the second gate structure; and,
  second gate sidewall spacers located on the first gate sidewall spacers,
  the second gate sidewall spacers filling spaces between the first gate sidewall spacers and the first facet shaped edge of the first raised epitaxial region adjacent to the first gate structure and the second facet shaped edge of the second raised epitaxial region adjacent to the second gate structure.

12. The semiconductor structure of claim 11, the first gate sidewall spacers, the second gate sidewall spacers and the trench sidewall spacers comprising the same dielectric materials.

13. The semiconductor structure of claim 11, the second gate sidewall spacers and the trench sidewall spacers comprising the same dielectric materials.

14. The semiconductor structure of claim 11, the silicide layers extending between the second gate sidewall spacers and the trench sidewall spacers.

15. A semiconductor structure comprising:
an oxide layer;
an active layer on the oxide layer;
a first gate structure and a second gate structure on the active layer;
a raised epitaxial layer on the active layer between the first gate structure and the second gate structure;
a trench extending vertically through the raised epitaxial layer and the active layer to the oxide layer such that a bottom of the trench comprises a portion of the oxide layer and such that the raised epitaxial layer comprises:
  a first raised epitaxial region located on the active layer between the first gate structure and the trench, the first raised epitaxial region having a first facet shaped edge adjacent to the first gate structure and a first vertical shaped edge opposite the first facet shaped edge; and,
  a second raised epitaxial region located on the active layer between the trench and the second gate structure, the second raised epitaxial region having a second facet shaped edge adjacent to the second gate structure and a second vertical shaped edge opposite the second facet shaped edge;
first gate sidewall spacers on opposing sidewalls of both the first gate structure and the second gate structure;
second gate sidewall spacers on the first gate sidewall spacers, the second gate sidewall spacers filling spaces between the first gate sidewall spacers and the first facet shaped edge of the first raised epitaxial region adjacent to the first gate structure and the second facet shaped edge of the second raised epitaxial region adjacent to the second gate structure;
silicide layers on the raised epitaxial layer, the silicide layers comprising:
  a first silicide layer on a first top surface only of the first raised epitaxial region; and,
  a second silicide layer on a second top surface only of the second raised epitaxial region; and,
trench sidewall spacers within the trench and comprising:
  a first trench sidewall spacer on the portion of the oxide layer at the bottom of the trench and positioned laterally immediately adjacent to a first sidewall of the trench so as to be positioned laterally immediately adjacent to the active layer, the first vertical shaped edge of the first raised epitaxial region, and the first silicide layer; and,
  a second trench sidewall spacer on the portion of the oxide layer at the bottom of the trench and positioned laterally immediately adjacent to a second sidewall of the trench opposite the first sidewall so as to be positioned laterally immediately adjacent to the active layer, the second vertical shaped edge of the second raised epitaxial region and the second silicide layer,
the second gate sidewall spacers and the trench sidewall spacers comprising remaining portions of a deposited and etched dielectric layer,
the first silicide layer extending laterally between the first trench sidewall spacer and a first one of the second gate sidewall spacers such that a first top surface of the first raised epitaxial region is covered by and immediately adjacent to the first silicide layer only, the first one of the second gate sidewall spacers being on a corresponding first one of the first gate sidewall spacers that is adjacent to the first gate structure, and
the second silicide layer extending laterally between the second trench sidewall spacer and a second one of the second gate sidewall spacers such that a second top surface of the second raised epitaxial region is covered by and immediately adjacent to the second silicide layer only, the second one of the second gate sidewall spacers being on a corresponding second one of the first gate sidewall spacers that is adjacent to the second gate structure.

16. The semiconductor structure of claim 15, the first raised epitaxial region corresponding to a first transistor device and the second raised epitaxial region corresponding to a second transistor device.

17. The semiconductor structure of claim 15, the active layer comprising an extremely thin silicon-on-insulator layer.

18. The semiconductor structure of claim 15, the first gate sidewall spacers, the second gate sidewall spacers and the trench sidewall spacers comprising the same dielectric materials.

19. The semiconductor structure of claim 15, the second gate sidewall spacers and the trench sidewall spacers comprising the same dielectric materials.

* * * * *